United States Patent
Brown et al.

(10) Patent No.: US 6,613,688 B1
(45) Date of Patent: Sep. 2, 2003

(54) SEMICONDUCTOR DEVICE AND PROCESS FOR GENERATING AN ETCH PATTERN

(75) Inventors: Thomas M. Brown, Austin, TX (US); Edward O. Travis, Austin, TX (US); Jeffrey C. Haines, Austin, TX (US)

(73) Assignees: Motorola, Inc., Schaumburg, IL (US); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/133,061

(22) Filed: Apr. 26, 2002

(51) Int. Cl.[7] ............................................. H01L 21/302
(52) U.S. Cl. ........................ 438/710; 451/41; 438/692
(58) Field of Search ........................ 438/710, 238–241, 438/424, 257, 272, 270, 692; 257/330

(56) References Cited

U.S. PATENT DOCUMENTS

| | | | | |
|---|---|---|---|---|
| 6,040,210 A | * | 3/2000 | Burns et al. | 438/238 |
| 6,045,435 A | * | 4/2000 | Bajaj et al. | 451/41 |
| 6,077,745 A | * | 6/2000 | Burns et al. | 438/270 |
| 6,114,725 A | * | 9/2000 | Furukawa et al. | 257/330 |
| 6,174,766 B1 | * | 1/2001 | Hayashi et al. | 438/241 |
| 6,194,038 B1 | * | 2/2001 | Rossman | 427/569 |
| 6,362,057 B1 | * | 3/2002 | Taylor et al. | 438/286 |
| 6,362,074 B2 | * | 3/2002 | Bohr | 438/424 |
| 6,380,084 B1 | * | 4/2002 | Lim et al. | 438/687 |
| 6,396,158 B1 | * | 5/2002 | Travis et al. | 257/784 |
| 6,435,942 B1 | * | 8/2002 | Jin et al. | 451/8 |
| 6,440,801 B1 | * | 8/2002 | Furukawa et al. | 438/272 |
| 6,452,284 B1 | * | 9/2002 | Sheck | 257/797 |
| 6,492,227 B1 | * | 12/2002 | Wang et al. | 438/257 |

OTHER PUBLICATIONS

Lee et al, "Using Smart Dummy Fill and Selective Reverse Etchback for aPattern Density Equalization," CMP–MIC Conference 2000 IMIC—500P/00/0255, pp. 255–257.

* cited by examiner

Primary Examiner—John F. Niebling
Assistant Examiner—Olivia Luk
(74) Attorney, Agent, or Firm—Damiel D. Hill; Kim-Marie Vo (57) ABSTRACT

A model-based approach for generating an etch pattern to decrease topographical uniformity involves placing reverse dummy features (50, 52, 70) in a region of a semiconductor substrate (40, 60) according to the topography of the region and adjacent regions. The reverse dummy features are placed inconsistently over the semiconductor substrate (40, 60) because the need for reverse dummy features is inconsistent and varies from design to design. In one embodiment, the reverse dummy features (50, 52, 70) having varying widths are placed with varying spacing between them and are placed in different regions. The determination of location, size and spacing of the reverse dummy features (50, 52, 70) is determined based upon the uniformity effect over the entire semiconductor die and may be used in conjunction with the placement of printed dummy features. After placing the reverse dummy features (50, 52, 70), a planarization process may be performed to remove the reverse dummy features, which improves the planarization.

23 Claims, 6 Drawing Sheets

SEMICONDUCTOR DEVICE AND PROCESS FOR GENERATING AN ETCH PATTERN

FIELD OF THE INVENTION

This invention relates in general to semiconductor devices, and more particularly, to a semiconductor device and a process for generating an etch pattern on a semiconductor device.

RELATED ART

During the manufacture of a semiconductor device, it may be necessary to planarize the surface of a semiconductor device as one or more of the manufacturing steps. Chemical Mechanical Polishing is one such process used to planarize surfaces of semiconductor devices. However, it is difficult to guarantee uniformity of the planarization because of varying layouts on the semiconductor device. The nonuniformity in thickness, caused by interactions between the layout and the polishing process, can result in electrical opens, high resistance contacts, electrical shorts, or other leakage paths in the integrated circuits.

Traditionally, tiling has been used in forming semiconductor devices to help solve the varying height problem. Tiles are printed dummy features used to fill in the low areas. There are several ways of choosing where to place the dummy features. A rule based process for tiling, or placing the dummy features, typically includes creating a circuit layout, defining a buffer zone (typically in a range of approximately 0.5–10 microns) around active features within the layout, and combining the circuit layout with the buffer zone to determine excluded areas. All other areas are available for tiling. Rule based tiling places tiles regardless of circuit density. Model based tiling is used to choose locations to place the tiles by taking into account the circuit density and other topographical considerations. However, in some cases, the use of tiles, or dummy features cannot solve all of the layout topographical uniformity problems.

Therefore, a need exists for a way to provide for better topographical uniformity of the surface of a semiconductor device.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Generally, the present invention provides a semiconductor device and method for insuring better planarization of a semiconductor wafer by adding reverse dummy features to predetermined selected areas of a circuit layout of the semiconductor device. The selected areas are areas that are generally higher than other areas of the semiconductor device. The reverse dummy features are used to remove material from relatively higher or more dense portions of the circuit layout. The present invention is defined by the claims and is better understood after reading the rest of the detailed description.

A number of terms are defined below to aid in the understanding the specification.

1. Active features are features that correspond to the designed circuitry for a semiconductor device. The active features include portions of transistors, capacitors, resistors, or the like. Active features include power supply features, which are designed to operate at a substantially constant potential, and signal features, which are designed to operate at one-potential under one set of electronic conditions and a different potential at another set of electronic conditions.

2. Integrated circuit area is the portion of the die with the active features. Typically, the integrated circuit area is bounded by bond pads near the edge of the die (not shown).

3. Dummy features include features printed onto a semiconductor device substrate, where the features are not any of the other types of features defined above. Different types of dummy features are used in semiconductor devices for various reasons. Dummy bit lines are used in memory arrays along the outermost edges to allow all the active bit lines in the array to be uniformly patterned. Unlike dummy bit lines, polishing dummy features are dummy features added at a feature level of a mask of a semiconductor device to improve polishing characteristics at the current or a subsequently formed level. A polishing dummy feature is not required for the proper operation of a device.

4. Reverse dummy features include features etched onto a semiconductor device substrate to aid in insuring planarization of a semiconductor device that is being polished. Like dummy features defined above, reverse dummy features are not needed for correct operation of the semiconductor device.

Figure 1:
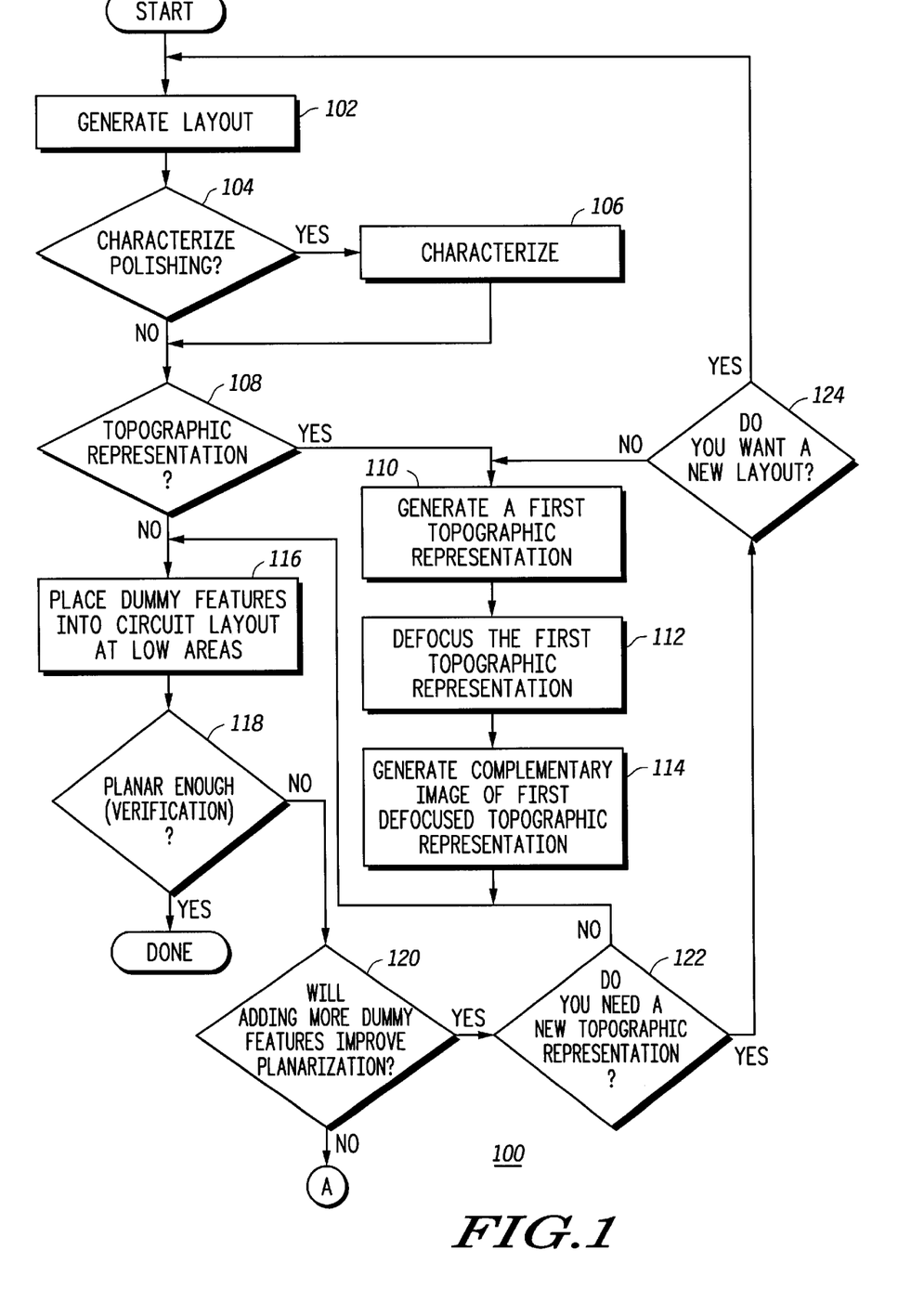
FIG. 1 illustrates a flow chart for a process in accordance with the present invention.

FIG. 1 illustrates a flow chart for a process 100 in accordance with the present invention. Process 100 starts by generating a layout (step 102). The layout at this point in time typically has active and control features. It does not have any polishing dummy features or reverse dummy features. The layout is then optionally processed for adjustments to the layout. The smallest geometry features may be resized to account for print or etch bias. Also, the resolution-assist features are typically added. In this specific embodiment, polishing dummy features are not present in the layout at this time. However, polishing dummy features could be present in other embodiments.

At step 104, a decision is made whether to characterize the polishing. If it is decided to characterize the polishing, the process proceeds to step 106. This characterization can be performed using test wafers. If it is decided that characterization is not needed, the process proceeds to step 108. The polishing characterization can be used to determine the minimum distance between the edge of the active features and the closest dummy features. In the illustrated embodiment, the polishing characterization can be done one time or at each iteration. The topographic representations and placement of dummy features can be iterated any number of times in a simulation or on a substrate. After verifying that the placement of the polishing dummy features is proper, a mask can be generated. Process flow continues at step 108. At step 108, it is determined if a topographic representation is wanted. If the answer is "yes" the YES path is taken step 110. At step 110, the topographic representation is generated. The topographical representation would have virtually all the active features, i.e. would show virtually all the gate electrodes, word lines, bit lines, interconnects, and the like. The topographic representation is made and can be in a spatial or frequency domain. In the spatial domain, the representation is similar to a contour map. A program capable of generating this type of representation is Hercules Hierarchical Design Verification software (also known as Hercules Hierarchical Design Rule Check software) made by Avant! Corporation of Fremont, Calif. A spatial representation can be converted to the frequency domain, and vice versa, using a Fourier transform function. At step 112, the first topographic representation is defocused. A simple way of defocusing is to obtain a color spatial map of the detailed topography and defocus your eyes. Another way to achieve lower resolution is to generate a transparency of the first representation and place it on an overhead projector. Make sure the image is out of focus to determine generally where the higher and lower points are. Another way to obtain the defocused topographic representation is to use a frequency domain representation of the first topographic representation and process it through a low pass filter. The low pass filter ignores the microscopic changes (high frequency changes in topography) but keeps the macroscopic changes (low frequency changes in topography).

At step 114, a complementary image of the first defocused topographic representation is generated. A complementary image is essentially the inverse image of the topographical representation. The complementary image can be in the spatial or frequency domain. After step 114, the process continues at step 116. At step 116, dummy features are placed in the circuit layout at low areas of the first topographic representation, or less dense areas of the semiconductor device.

At decision step 108, if it is determined that a topographical representation is not needed, the NO path is taken to step 116 where dummy features are placed in the circuit layout. At decision step 118, it is determined if the device is planar enough. If the device is planar enough, the process is complete. If the device is not planar enough, the "NO" path is taken to decision step 120. At decision step 120, it is determined if adding more dummy features will improve planarization. If more dummy features will improve planarization, the YES path is taken to decision step 122. Note that the step of planarizing can be accomplished using chemical mechanical polishing, etchback, and spin-on coating. If adding more dummy features will not improve planarization, then the process continues at "A" in FIG. 2 below. At decision step 122, it is determined if a new topographic representation is needed. If a new topographic representation is needed, the YES path is taken to decision step 124. If a new topographic representation is not needed, the process continues at step 116 and repeats until the device is planar enough. At decision step 124, it is determined if a new layout is needed. If a new layout is needed, the process continues at step 102. If a new layout is not needed, the NO path is taken to step 110, previously discussed and the process continues until the device is planar enough.

Figure 2:
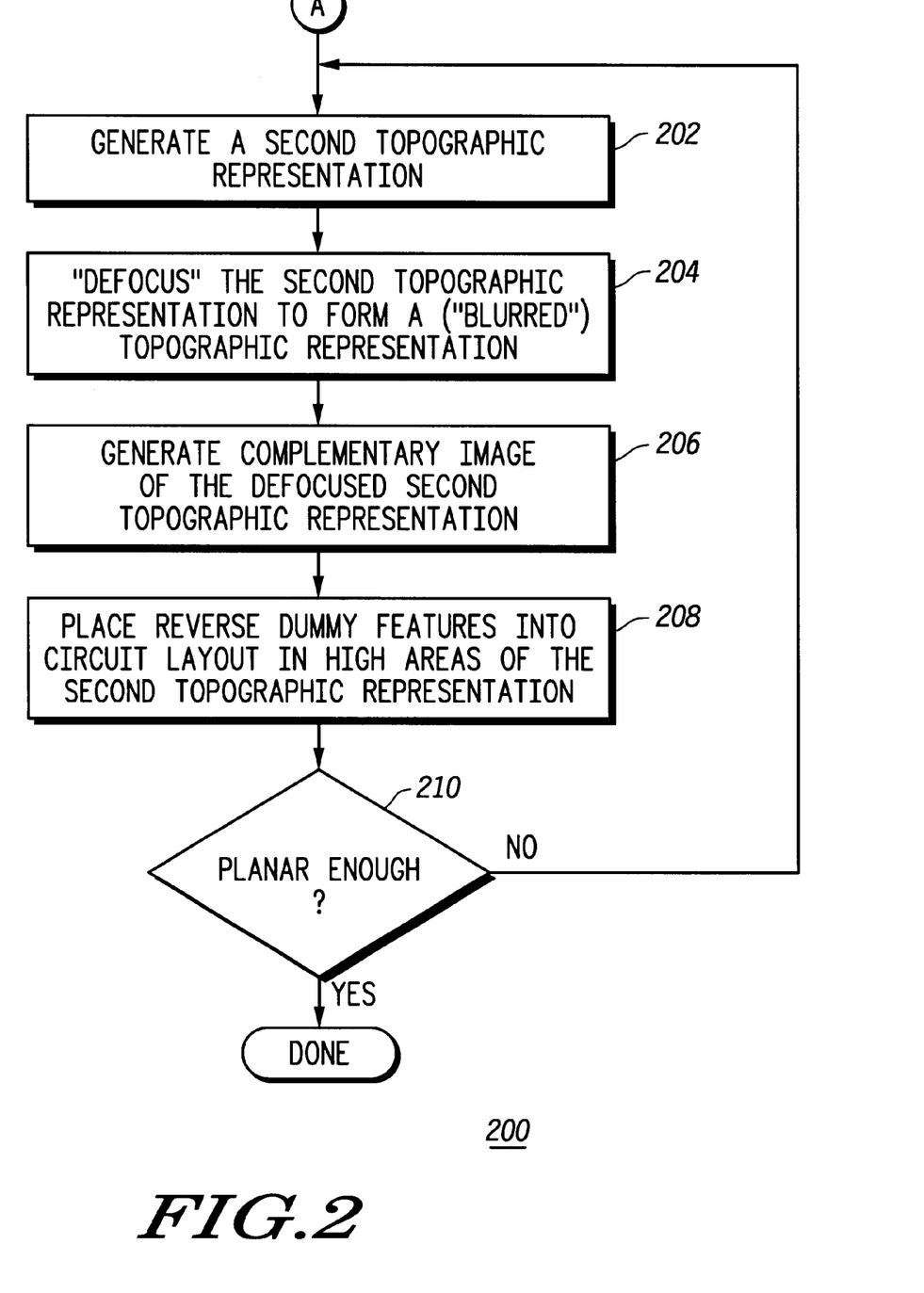
FIG. 2 illustrates a flow chart for a process in accordance with the present invention.

FIG. 2 illustrates a flow chart for a process 200 to add reverse dummy features in accordance with the present invention. Process 200 begins at "A", after step 120, where it was determined that more dummy features would not improve planarization. At step 202, a second topographical representation is generated. At step 204, the second topographical representation is defocused to generated a defocused topographical representation. The defocused topographical representation is used to show the high and low points of the semiconductor device. At step 206, a complementary image of the second topographical representation is generated. At step 208, reverse dummy features are added into the circuit layout in high, or dense, areas of the second topographical representation. At decision step 210 it is determined if the semiconductor device is planar enough. If the device is planar enough, the process is done. If the device is not planar enough, the YES path is taken back to step 202, and the process is repeated until the desired results are achieved.

Figure 3:
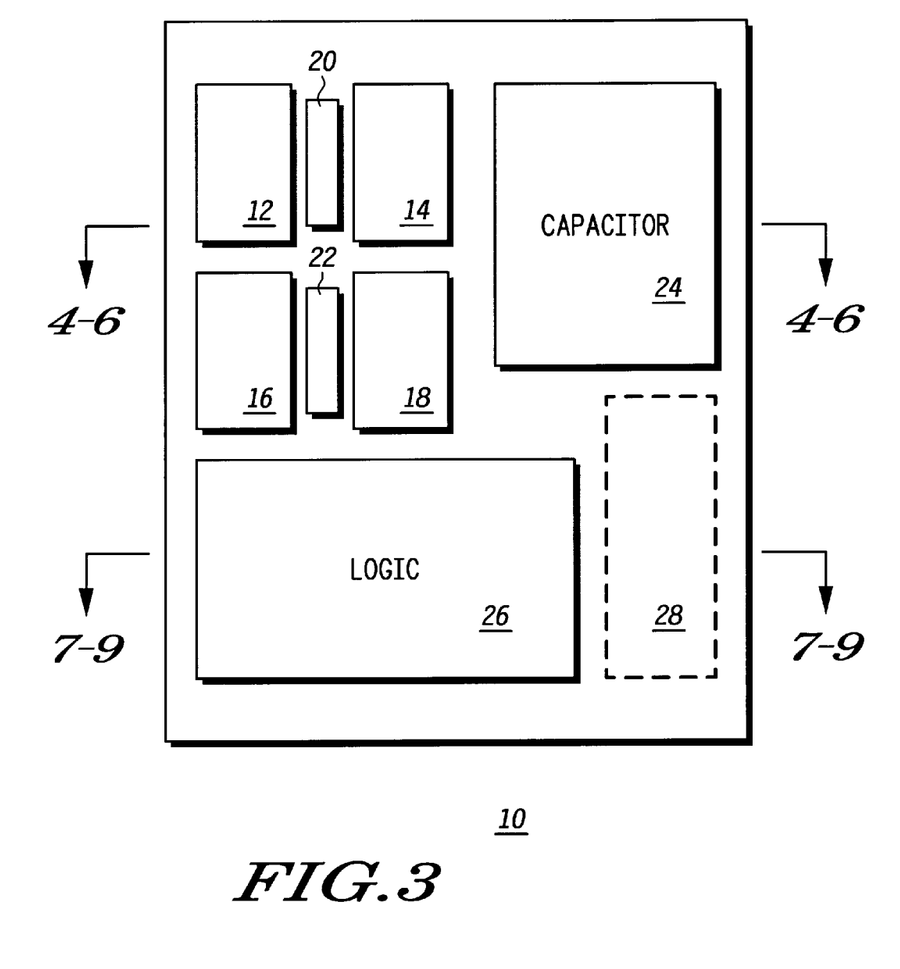
FIG. 3 illustrates a top view of a semiconductor device useful for describing the present invention.

FIG. 3 illustrates a top view of a semiconductor device 10 useful for describing the present invention. Semiconductor device 10 includes memory arrays 12, 14, 16, and 18, capacitors 20, 22, and 24, logic circuits 26 and empty space 28. Semiconductor device 10 is intended to illustrated some circuit types encountered in integrated circuit designs, and is not intended to include circuits to accomplish any specific functionality in semiconductor device 10. Different types of memory arrays may be used for memory arrays 12, 14, 16, and 18, including for example, (static random access memory (SRAM), dynamic random access memory (DRAM), floating gate memory arrays, ferroelectric random access memory (FERAM) arrays, etc.).

Different circuit types have a different feature density. As used in this specification, feature density for a region is the percentage of the region covered by any type of feature compared to the total area in that region not occupied by any features. Put in other terms, the feature density is a function of the percentage of the area in the region occupied feature (s) divided by the total area in the region as well as the step coverage characteristic of the exposed oxide layer 39. Memory arrays 12, 14, 16, and 18 have relatively dense circuitry (for example, closely spaced active features, polycide word lines, metal word lines, and bit lines). Although logic area 26 will have some localized dense circuit regions, its overall circuit density is significantly lower than the circuit density of the memory arrays 12, 14, 16, and 18. Capacitors 20, 22, and 24 are the most dense areas.

Figure 4:
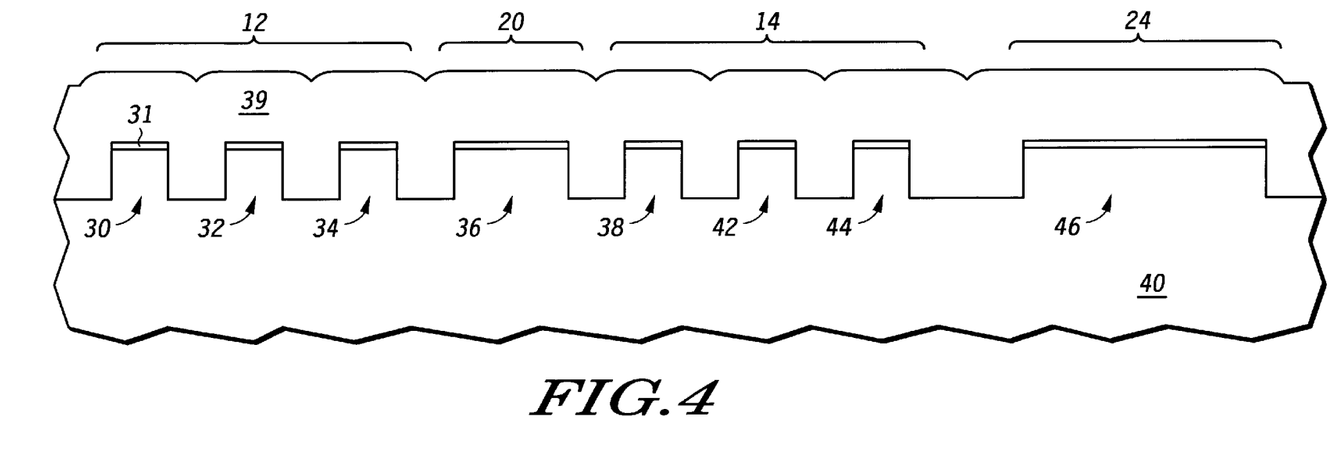
FIG. 4 illustrates a cross section of a portion of the semiconductor device of FIG. 3 before the step of placing reverse dummy features.

FIG. 4. illustrates a cross section of a portion 40, taken along a line 4–6 of the semiconductor device of FIG. 3 before the step of placing reverse dummy features. Portion 40 includes features 30, 32, and 34 of memory array 12, feature 36 of capacitor 20, features 38, 42, and 44 of memory array 14, and feature 46 of capacitor 24. A nitride layer 31 is deposited on the top of each of the features in FIG. 4. An oxide layer 39 is deposited over the portion 40 using a conventional conformal oxide deposition process such as TEOS. FIG. 4 shows how the overlying insulating, or oxide layer 39 has a topography along its upper that varies with the contours of the underlying active features. Note that the process of the present invention also applies to non-conformal oxide deposition equally well such as for example HDP (high density plasma).

Figure 5:
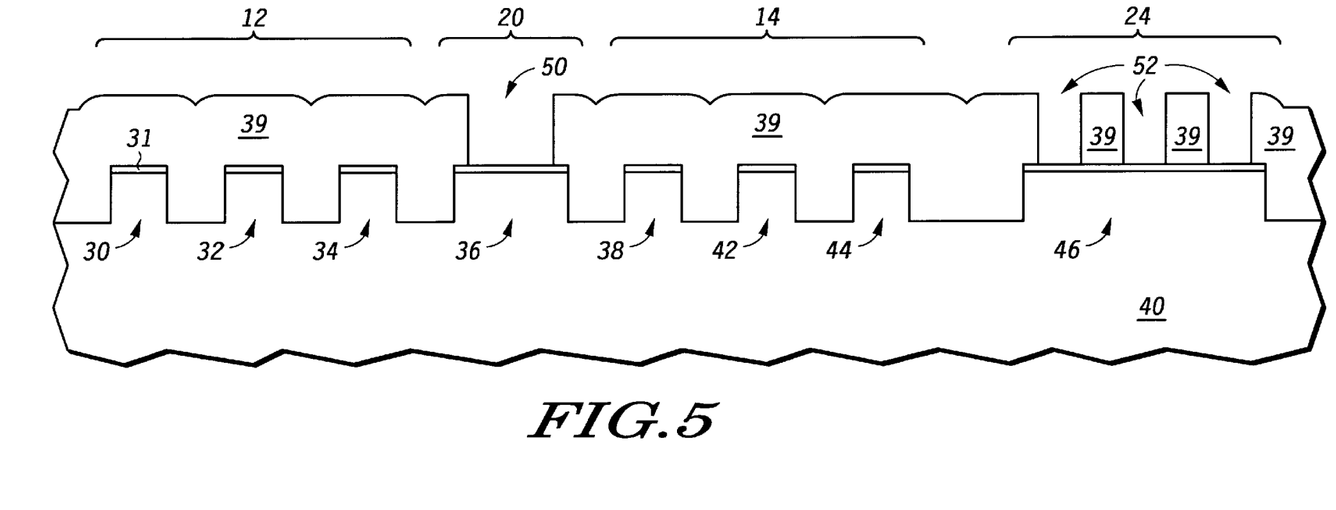
FIG. 5 illustrates a cross section of a portion of the semiconductor device of FIG. 3 after placing reverse dummy features in the semiconductor device.

FIG. 5 illustrates a cross section of portion 40 of the semiconductor device of FIG. 3 after etching reverse dummy features in the semiconductor device. In FIG. 5, the process of FIG. 2 is used to place reverse dummy features in the areas of semiconductor device 10 that are relatively higher density. For example, a reverse dummy feature 50 is etched over capacitor 20. The reverse dummy feature 50 is etched to the nitride layer 31. Also, several reverse dummy features 52 are formed over capacitor 24. Reverse dummy feature 50 had to be etched to a maximum width in FIG. 4 because the features 30, 32, and 34 of memory array 12 and the features 38, 42, and 44 of memory array 14 were below a minimum feature size to be etched. Reverse dummy features 52 were created because etching a maximum width would result in too much material over capacitor 24 being removed.

A region is large enough to accept a reverse dummy feature (or a dummy feature) if its width is greater than a minimum distance between two reverse dummy features plus two times a width of the reverse dummy feature. The minimum width of a reverse dummy feature is at least as large as the minimum lithographically resolvable feature.

Figure 6:
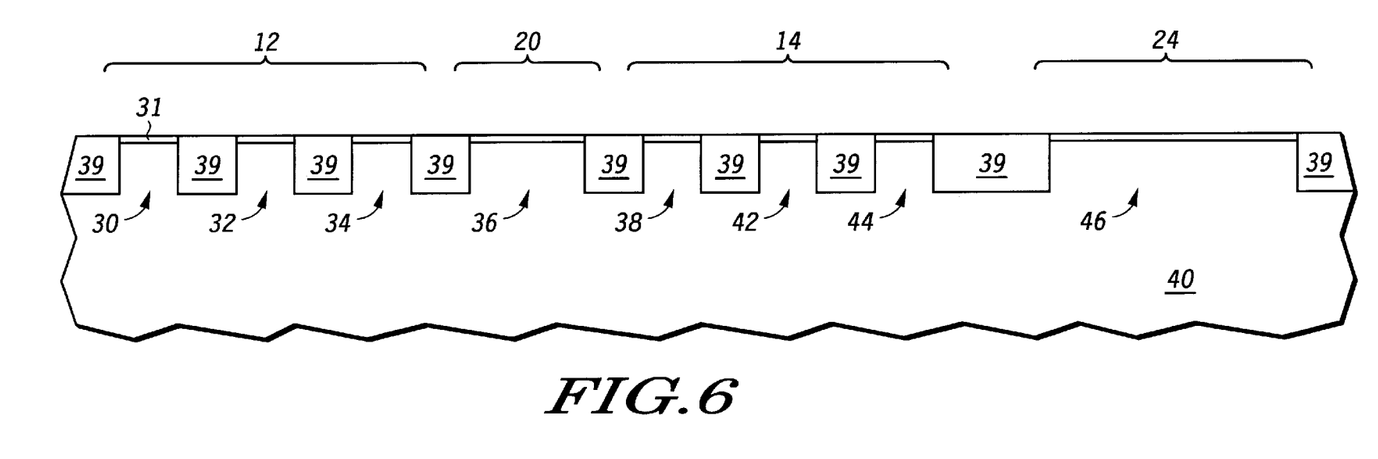
FIG. 6 illustrates a cross section of a portion of the semiconductor device of FIG. 3 after planarizing he semiconductor device.

FIG. 6 illustrates a cross section of portion 40 of the semiconductor device of FIG. 3 after planarizing the semiconductor device. The planarization method can be a chemical mechanical polishing (CMP) process, or an etch back technique comprising coating a surface and planarizing the surface using a non-selective etch. The coating can be a resist, polymer, or a spin-on-glass (SOG). The coating can be left on if desired.

Figure 7:
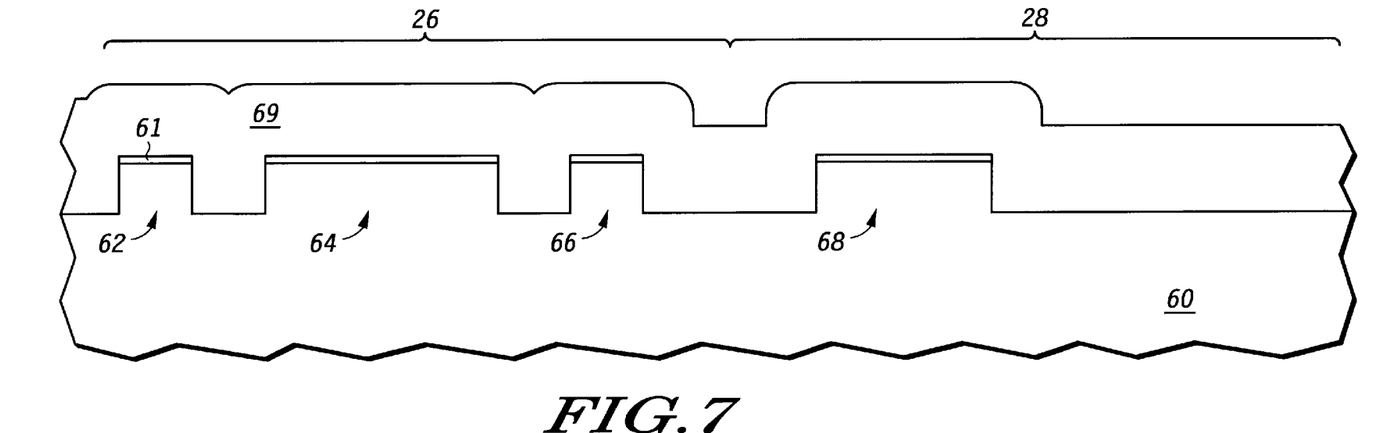
FIG. 7 illustrates a cross section of a portion of the semiconductor device of FIG. 3 before the step of placing reverse dummy features.

FIG. 7 illustrates a cross section of a portion 60 of the semiconductor device of FIG. 3 before the step of placing reverse dummy features. Portion 60 is taken along the lines 7–9 of FIG. 3. Features 62, 64, and 66 are a part of logic circuit 26. Feature 68 is a tile, or dummy feature, that was placed in empty space 28 using the process 100 of FIG. 1. Note that there may be more than one tile in empty space 28. Also, dummy feature 68 is inserted into the mask at the same level as active features 62, 64, and 66. A nitride layer 61 is deposited on top of the active features 62, 64, 66, and 68. An oxide layer 69 is deposited over the active features.

Figure 8:
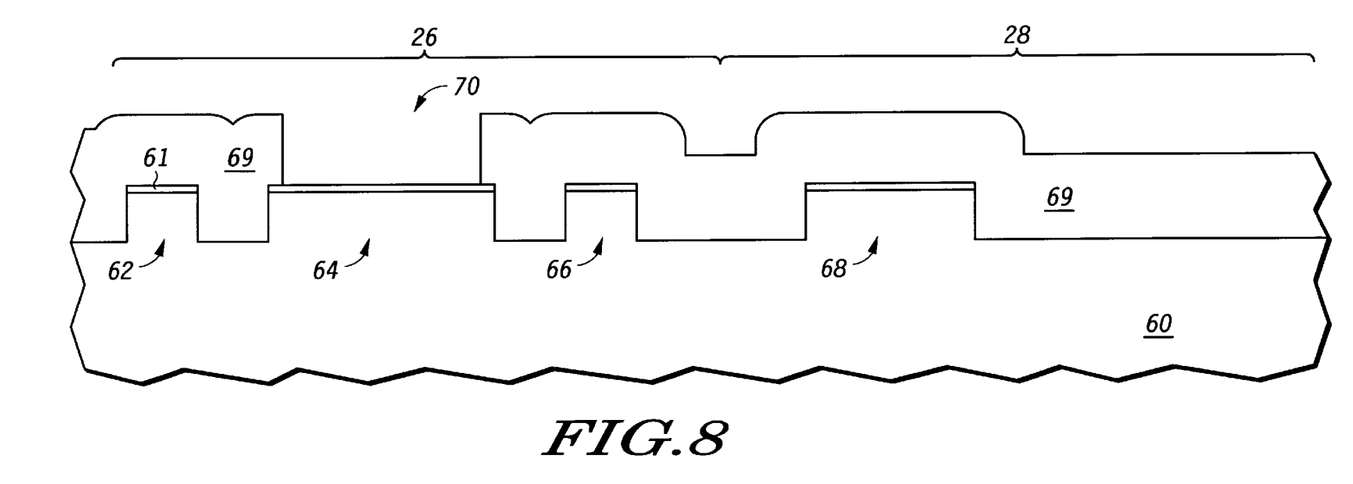
FIG. 8 illustrates a cross section of a portion of the semiconductor device of FIG. 3 after placing reversed dummy features in the semiconductor device.

FIG. 8 illustrates a cross section of portion 60 of the semiconductor device of FIG. 3 after placing reverse dummy features in the semiconductor device. A reverse dummy feature 70 is formed over feature 64 using the process 200 of FIG. 2. Note that active features 62 and 66 were too small to accommodate a reverse dummy feature. The reverse dummy feature 70 is etched to the nitride layer 31. Note that a reverse dummy feature is not placed over dummy feature 68 because the density of empty space 28 would be too low.

Figure 9:
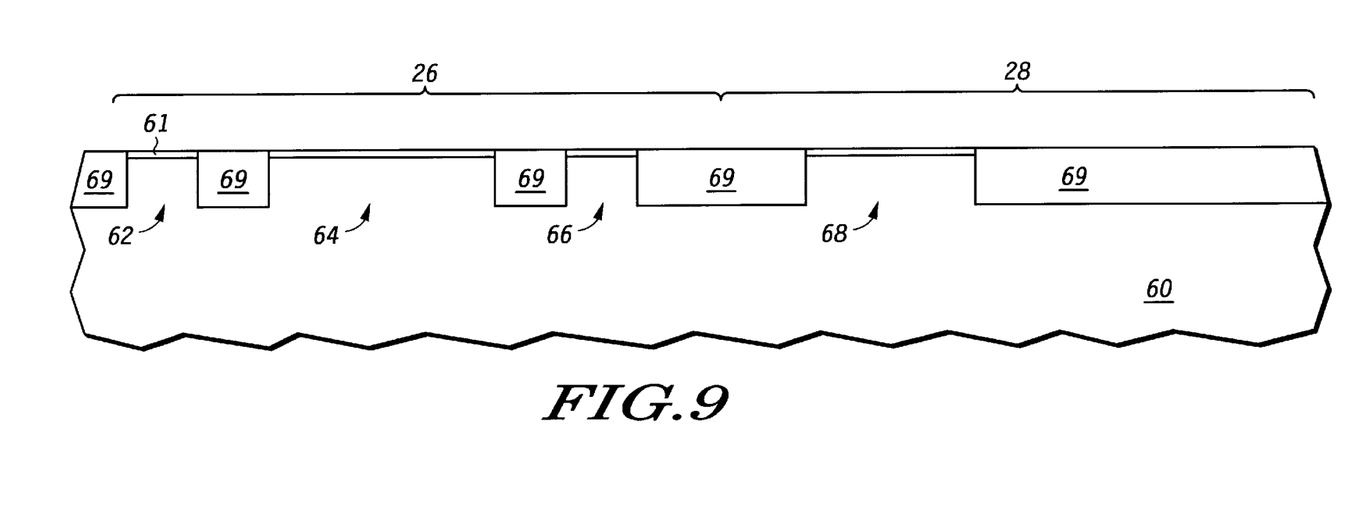
FIG. 9 illustrates a cross section of a portion of the semiconductor device of FIG. 3 after planarizing the semiconductor device.

FIG. 9 illustrates a cross section of portion 60 of the semiconductor device of FIG. 3 after planarizing the semiconductor device. The planarization method can be a chemical mechanical polishing (CMP) process, or an etch back technique comprising coating a surface and planarizing the surface using a non-selective etch. The coating can be a resist, polymer, or a spin-on-glass (SOG). The coating can be left on if desired.

By using a model based approach to adding reverse dummy features (etch back approach) to a circuit layout, better uniformity can be achieved than using dummy features alone. The reverse dummy features are placed inconsistently (in areas of high circuit density) because the need for reverse-dummy features is inconsistent from one part of the chip to another and varies from design to design. Also, the process can be implemented as a mask preparation procedure. In addition, it allows unlimited use of dummy feature block layers giving designers freedom of layout to reduce chip area.

The placement of dummy features and reverse dummy features may be simultaneously optimized, or they may be optimized separately. In other words, if a circuit layout will only have dummy features, the placement of the dummy features in the circuit layout may be different than if the dummy features were to be used in combination with reverse dummy features. Likewise, if the circuit layout will only have reverse dummy features, the placement of the reverse dummy features may be different than if both dummy features and reverse dummy features were used.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for generating an etch pattern to decrease topographical nonuniformity, the method comprising:
   providing a semiconductor substrate having a first feature with a first width and a second feature with a second width;
   forming an exposed layer over the first feature and the second feature;
   etching a first recess over the first feature, wherein the first recess has a third width; and
   etching a second recess over the second feature, wherein the second recess has a fourth width and the difference between the first width and the third width is different than the difference between the second width and the fourth width.

2. The process of claim 1, wherein the first recess and the second recess are reverse dummy features.

3. The process of claim 1, wherein the exposed layer is an insulating layer.

4. The process of claim 3, further comprising a step of forming a nitride layer over the semiconductor substrate before forming the exposed layer.

5. The process of claim 4, wherein etching the first recess and etching the second recess further comprises removing portions of the exposed layer to expose the nitride layer.

6. The process of claim 1, wherein etching the first recess and etching the second recess further comprises forming the first recess and the second recess within the exposed layer leaving a portion of the exposed layer at the bottom of the first recess and the bottom of the second recess.

7. The process of claim 1, further comprising planarizing the exposed layer, after etching the exposed layer, to remove substantially all of the first recess and the second recess.

8. The process of claim 7, wherein planarizing is a method selected from the group consisting of chemical mechanical polishing, etchback, and spin-on coating.

9. A process for generating an etch pattern to decrease topographical nonuniformity, the method comprising:
   providing a semiconductor substrate having a first feature area and a second feature area, wherein the first feature area has a first reverse dummy feature available area and the second feature area has as second reverse dummy feature available area;
   forming an exposed layer over the first feature area and the second feature area; and
   etching a recess in a first reverse dummy feature available area without forming a recess in the second reverse dummy feature available area.

10. The process of claim 9, further comprising generating a topographic representation of the first feature area and the second feature area to determine a high density area and a low density area, wherein the high density area corresponds to the first reverse dummy feature available area and the low density area corresponds to the second reverse dummy feature available area.

11. The process of claim 9, further comprising planarizing the exposed layer, after etching the exposed layer, to remove substantially all of the first recess and the second recess.

12. The process of claim 11, wherein planarizing is a method selected from the group consisting of chemical mechanical polishing, etchback, and spin-on coating.

13. The process of claim 9, wherein the second feature area is an open region.

14. The process of claim 13, wherein the second feature area comprises a tile.

15. The process of claim 9, wherein etching the recess further comprises forming the recess within the exposed layer leaving a portion of the exposed layer at the bottom of the recess.

16. The process of claim 9, wherein etching the recess further comprises forming a first hole through the exposed layer.

17. A process for generating an etch pattern to decrease topographic nonuniformity, the method comprising:
   providing a semiconductor substrate having a first feature area and a second feature area, wherein the first feature area has a first reverse dummy feature available area and the second feature area has as second reverse dummy feature available area;
   forming an exposed layer over the first feature area and the second feature area;
   forming a plurality of reverse dummy features in the first reverse dummy feature available area, wherein the plurality of reverse dummy features has a middle dummy feature located between two reverse dummy features of the plurality of reverse dummy features, wherein the middle dummy feature has a first width; and
   forming a second reverse dummy feature having a second width in the second reverse dummy feature available area, wherein the second width is greater than the first width.

18. The process of claim 17, further comprising planarizing the exposed layer, after etching the exposed layer, to remove substantially all of the reverse dummy feature in the second reverse dummy feature available area and the plurality of reverse dummy features in the first reverse dummy feature available area.

19. The process of claim 17, wherein planarizing is a method selected from the group consisting of chemical mechanical polishing, etchback, and spin-on coating.

20. A method for decreasing topographic nonuniformity of a semiconductor device, the method comprising the steps of:
   generating a topographic representation of a surface of the semiconductor device;
   locating reverse dummy features on relatively higher areas of the surface of the semiconductor device, wherein the relatively higher areas are determined from the topographic representation;
   etching the reverse dummy features to remove material from the relatively higher areas of the surface of the semiconductor device; and
   polishing the surface of the semiconductor device.

21. The method of claim 20, wherein the step of generating a topographic representation of the surface of the semiconductor device further comprises the steps of:
   defocusing the topographic representation to form an out-of-focus topographic representation;
   generating a complementary image of the out-of-focus topographic representation, wherein the complementary image is used to located the relatively higher areas of the semiconductor device.

22. The method of claim 20, further comprising the step of locating dummy features into relatively low areas of the semiconductor device.

23. The method of claim 20, wherein the step of polishing is a method selected from the group consisting of chemical mechanical polishing, etchback, and spin-on coating.

* * * * *